(12) United States Patent
Tran et al.

(10) Patent No.: US 11,069,411 B2
(45) Date of Patent: *Jul. 20, 2021

(54) PROGRAMMING CIRCUIT AND METHOD FOR FLASH MEMORY ARRAY

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US); Hung Quoc Nguyen, Fremont, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 7 days.

This patent is subject to a terminal disclaimer.

(21) Appl. No.: 16/574,059

(22) Filed: Sep. 17, 2019

(65) Prior Publication Data

US 2021/0082516 A1    Mar. 18, 2021

Related U.S. Application Data

(62) Division of application No. 15/687,191, filed on Aug. 25, 2017, now Pat. No. 10,460,810, which is a division of application No. 14/791,213, filed on Jul. 2, 2015, now Pat. No. 9,767,911, which is a division of application No. 13/830,207, filed on Mar. 14, 2013, now Pat. No. 9,093,161.

(51) Int. Cl.
| | |
|---|---|
| *G11C 16/12* | (2006.01) |
| *G11C 16/24* | (2006.01) |
| *G11C 16/04* | (2006.01) |

(52) U.S. Cl.
CPC .......... *G11C 16/12* (2013.01); *G11C 16/0425* (2013.01); *G11C 16/24* (2013.01)

(58) Field of Classification Search
CPC ...... G11C 16/12; G11C 16/0425; G11C 16/24
See application file for complete search history.

(56) References Cited

U.S. PATENT DOCUMENTS

| | | | |
|---|---|---|---|
| 5,659,514 | A | 8/1997 | Hazani |
| 5,986,937 | A | 11/1999 | Yero |
| 5,999,451 | A | 12/1999 | Lin et al. |
| 6,028,791 | A | 2/2000 | Tanaka |
| 6,163,483 | A | 12/2000 | Pasotti et al. |
| 6,275,415 | B1 | 8/2001 | Haddad et al. |

(Continued)

FOREIGN PATENT DOCUMENTS

CN        1905066 A      1/2007

OTHER PUBLICATIONS

Beards, Peter H., "Analog and Digital Electronics," 1987, Prentice Hall, London, UK, XP002724636, ISBN: 0-13-035312-4, pp. 195-197.

*Primary Examiner* — Mushfique Siddique
(74) *Attorney, Agent, or Firm* — DLA Piper LLP US

(57) ABSTRACT

An improved method and apparatus for programming advanced nanometer flash memory cells is disclosed. In one embodiment, a programming circuit comprises a switch configured to couple a current source to a capacitor during a first mode and to uncouple the current source from the capacitor during the second mode, wherein during the second mode the capacitor is coupled to the gate of a transistor used to program a memory cell.

4 Claims, 6 Drawing Sheets

(56) References Cited

U.S. PATENT DOCUMENTS

| | | | |
|---|---|---|---|
| 6,429,472 B2 | 8/2002 | Kim | |
| 6,518,799 B2 | 2/2003 | Yoshida | |
| 6,567,314 B1 | 5/2003 | Ogura et al. | |
| 6,747,484 B1 | 6/2004 | Adlerstein | |
| 6,856,124 B2 | 2/2005 | Dearn | |
| 7,295,485 B2 | 11/2007 | Hong et al. | |
| 7,564,712 B2 | 7/2009 | Lee | |
| 7,800,968 B2 * | 9/2010 | Kern | G11C 16/28 365/207 |
| 7,990,773 B2 | 8/2011 | Tran et al. | |
| 8,059,454 B2 | 11/2011 | Li | |
| 8,077,521 B2 * | 12/2011 | Bode | G11C 16/3418 365/185.21 |
| 8,238,158 B2 | 8/2012 | Shelton | |
| 8,379,452 B2 | 2/2013 | Nagamatsu | |
| 8,422,269 B2 * | 4/2013 | Sasaki | G11C 13/0064 365/148 |
| 9,093,161 B2 * | 7/2015 | Tran | G11C 16/24 |
| 10,460,810 B2 * | 10/2019 | Tran | G11C 16/30 |
| 2002/0131301 A1 | 9/2002 | Elmhurst | |
| 2003/0058728 A1 | 3/2003 | Tran | |
| 2003/0128594 A1 | 7/2003 | Tran | |
| 2003/0235086 A1 | 12/2003 | Lin | |
| 2004/0196695 A1 | 10/2004 | Tanaka | |
| 2004/0218422 A1 | 11/2004 | Nguyen | |
| 2004/0240269 A1 | 12/2004 | Cernea | |
| 2005/0201152 A1 | 9/2005 | Nguyen | |
| 2005/0219914 A1 | 10/2005 | Sarin et al. | |
| 2005/0249022 A1 | 11/2005 | Martines et al. | |
| 2005/0254305 A1 | 11/2005 | Ogura et al. | |
| 2006/0083064 A1 | 4/2006 | Edahiro | |
| 2008/0123427 A1 | 5/2008 | Hsu | |
| 2008/0137409 A1 | 6/2008 | Nakamura | |
| 2008/0192545 A1 | 8/2008 | Chen | |
| 2011/0157958 A1 * | 6/2011 | Sasaki | G11C 13/0064 365/148 |
| 2011/0235397 A1 * | 9/2011 | Sasaki | G11C 16/24 365/148 |
| 2012/0033491 A1 | 2/2012 | Shelton et al. | |
| 2015/0008496 A1 * | 1/2015 | Chakrabartty | H01L 28/40 257/298 |

\* cited by examiner

PROGRAMMING CIRCUIT AND METHOD FOR FLASH MEMORY ARRAY

PRIORITY CLAIM

This patent application is a divisional application of U.S. patent application Ser. No. 15/687,191, filed on Aug. 25, 2017, and titled "Dynamic Programming Of Advanced Nanometer Flash Memory," which is a divisional application of U.S. patent application Ser. No. 14/791,213, filed on Jul. 2, 2015, titled "Dynamic Programming Of Advanced Nanometer Flash Memory," and issued on Sep. 19, 2017 as U.S. Pat. No. 9,767,911, which is a divisional application of U.S. patent application Ser. No. 13/830,207, filed on Mar. 14, 2013, titled "Dynamic Programming of Advanced Nanometer Flash Memory," and issued on Jul. 28, 2015 as U.S. Pat. No. 9,093,161, each of which is incorporated herein by reference in its entirety.

TECHNICAL FIELD

An improved method and apparatus for programming advanced nanometer flash memory cells is disclosed.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

The prior art includes a common technique for programming a flash memory cell. In the prior art technique, a high voltage is applied on the drain of the memory cell, a bias voltage on the control gate of the memory cell, and a bias current on the source of the memory cell. The programming essentially places electrons on the floating gate of the memory cell. This is described in U.S. Pat. No. 7,990,773, "Sub Volt Flash Memory System," by Hieu Van Tran, et al, which is incorporated herein by reference.

An example of prior art circuitry for providing the bias current applied to the source of each memory cell is shown in FIG. 1. Flash memory system 10 comprises flash memory array 30, horizontal decoder 20, and vertical decoder 50. Horizontal decoder 20 selects the row (often called the word line) within flash memory array 30 to be read or written, and vertical decoder 50 selects the column (often called the bit line, here labeled IO0, IO1, ..., ION-1, ION) within flash memory array 30 to be read or written. Vertical decoder 50 comprises a series of multiplexers (labeled YMUX0, YMUX1, ..., YMUXN-1, YMUXN) coupled to flash memory array 30. Flash memory array 30 comprises N blocks of cells, and each block is coupled to one of the bit lines IO0, ..., ION and one multiplexer within vertical decoder 50. Current source 40 is coupled to N current mirrors, current mirror $60_1$ through current mirror $60_N$.

One drawback of the prior art method of programming flash memory cells is that current mirrors, such as current mirrors $60_1$ through $60_N$, often are mismatched due to natural variations and manufacturing variances, and in large chips, the ground potential also might vary. As a result, during operation the current mirrors actually may draw less or more current than they are supposed to draw.

What is needed is an improved method and apparatus for programming flash memory cells, particularly advanced nanometer flash memory cells, that reduces or eliminates the variability among the bias current sources used during the programming process.

SUMMARY OF THE INVENTION

The aforementioned problems and needs are addressed through two different embodiments.

In one embodiment, two or more current mirrors are averaged together to draw current from each block in the memory array during the programming process, instead of using just one current mirror. The end result is less variability in the current drawn in programming each cell.

In another embodiment, each current mirror is initialized prior to operation, and a capacitor is used to keep the current mirror at or near the initialized state.

DETAILED DESCRIPTION OF THE PREFERRED EMBODIMENTS

Figure 1:
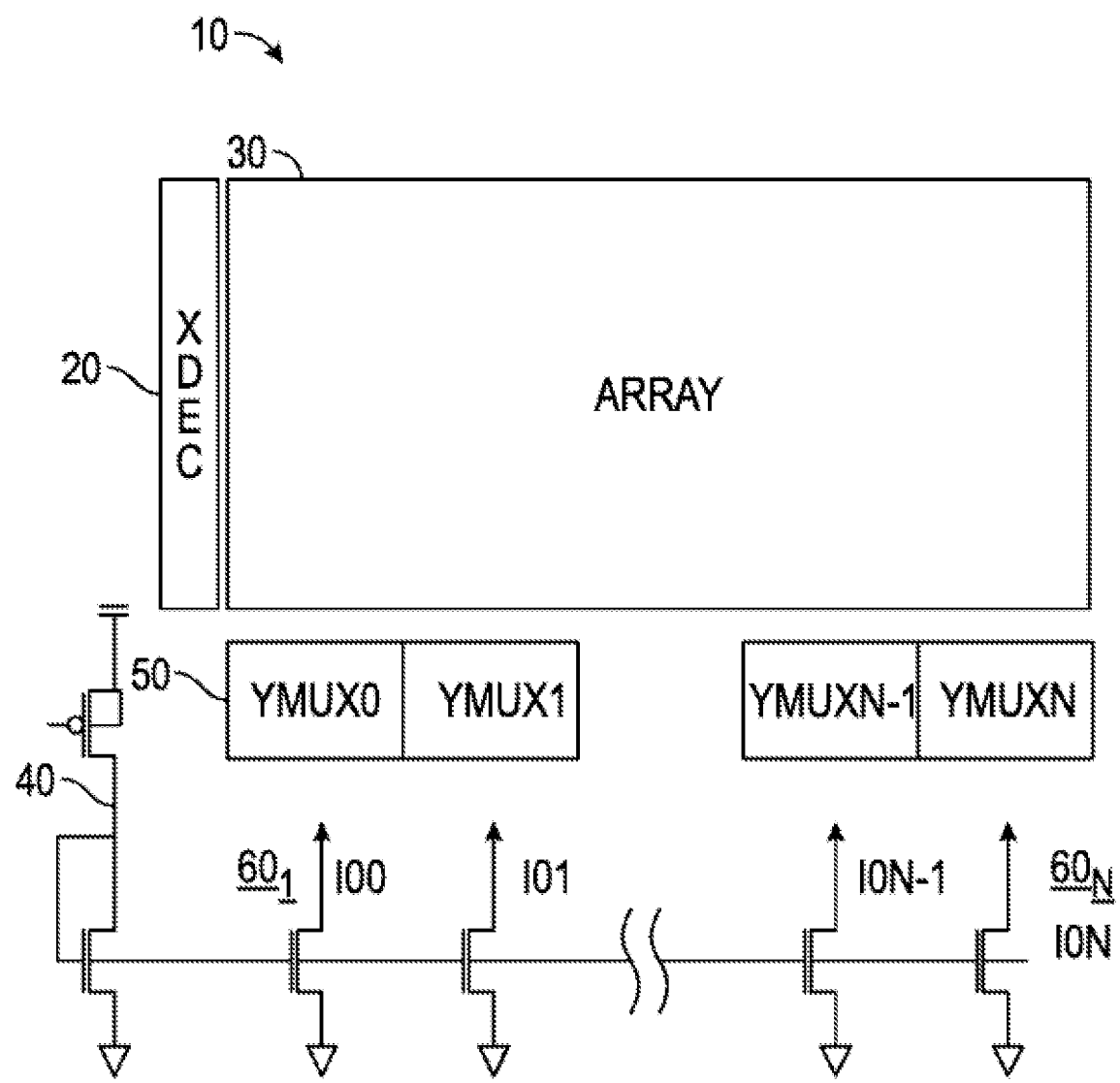
FIG. 1 depicts a prior art circuit for programming a memory circuit.

In the prior art system of FIG. 1, the current drawn by current mirrors $60_1$ ... $60_N$ can vary substantially in the real world. For example, if each current mirror ideally should draw 1.00 µA, the inventors have found that in the real world, some typical measured values might be as shown in Table 1:

TABLE 1

| Current Mirror | Current |
|---|---|
| IB0 | 1.32 µA |
| IB1 | 0.64 µA |
| IB2 | 1.62 µA |
| IB3 | 0.71 µA |

Table 1 depicts four exemplary current mirrors, labeled IB0, IB1, IB2, and IB3. As can be seen, the variance in current is significant. One way to compensate for the variance is to use averages of the current mirrors. For example, the average of IB0 and IB1 is 0.98 µA, the average of IB2 and IB3 is 1.165 µA, and the average of IB0, IB1, IB2, and IB3 is 1.0725 µA. Based on this simple example, the deviation in current from the ideal of 1.00 µA is reduced from 62% for individual current mirrors to 16.5% for averaging two current mirrors and 7.3% for averaging four current mirrors.

With this observation in mind, an embodiment is now described with reference to FIG. 2. Programming circuit 100 comprises current mirrors 110, 111, 112, and 113 and bit lines 160, 170, 180, and 190. Current mirror 110 can be coupled to bit lines 160, 170, 180, and 190 through switches 120, 130, 140, and 150, respectively. Similarly, current mirror 111 can be coupled to bit lines 160, 170, 180, and 190 through switches 121, 131, 141, and 151, respectively; current mirror 112 can be coupled to bit lines 160, 170, 180, and 190 through switches 122, 132, 142, and 152, respectively; and current mirror 113 can be coupled to bit lines 160, 170, 180, and 190 through switches 123, 133, 143, and 153, respectively. In this design, controller 200 creates control signals 201, 202, 203, and 204 to control the switches. For example, switches 120, 121, 122, and 123 are controlled by control signal 201, 202, 203, and 204 respectively; switches 130, 131, 132, and 133 are controlled by control signal 204, 201, 202, and 203 respectively; switches 140, 141, 142, and 143 are controlled by control signal 203, 204, 201, and 202 respectively; and switches 150, 151, 152, and 153 are controlled by control signal 202, 203, 204, and 201 respectively.

Figure 3:
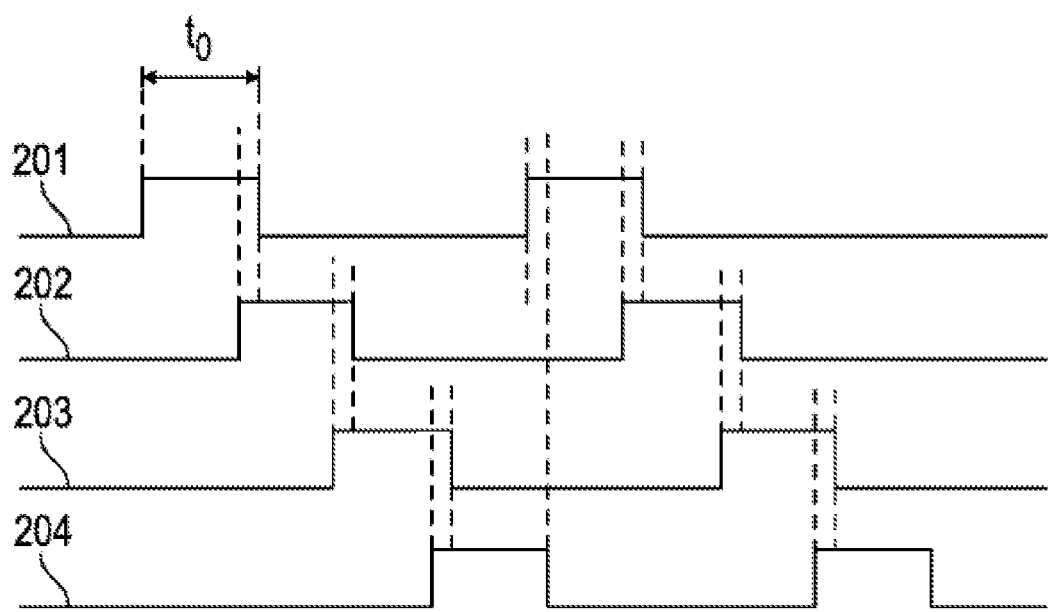
FIG. 3 depicts a timing diagram for the activation of switches depicted in FIG. 2.

In FIG. 3, an example of control signals 201, 202, 203, and 204 generated by controller 200 are shown. Here, a high voltage represents that the switches controlled by the control signal are turned "on," and a low voltage represents that the switches controlled by the control signal are turned "off." FIG. 3 depicts two periods of programming of flash memory cells, such as advanced nanometer flash memory cells. During the first period, control signal 201 is high for a period to, then control signal 202 is high for a period to, then control signal 203 is high for a period to, and then control signal 204 is high for a period to. As shown in FIG. 3, there is some intentional overlap between the high voltage occurrences of the control signals.

The end result is that bit lines 160, 170, 180, and 190 each are coupled to current mirrors 110, 111, 112, and 113 in equal amounts during a single programming period. This effectively averages the current drawn from each bit line across current mirrors 110, 111, 112, and 113. As discussed above, this temporal averaging effect will reduce the variation in programming current based on mismatches and other variations in the current mirrors.

Figure 2:
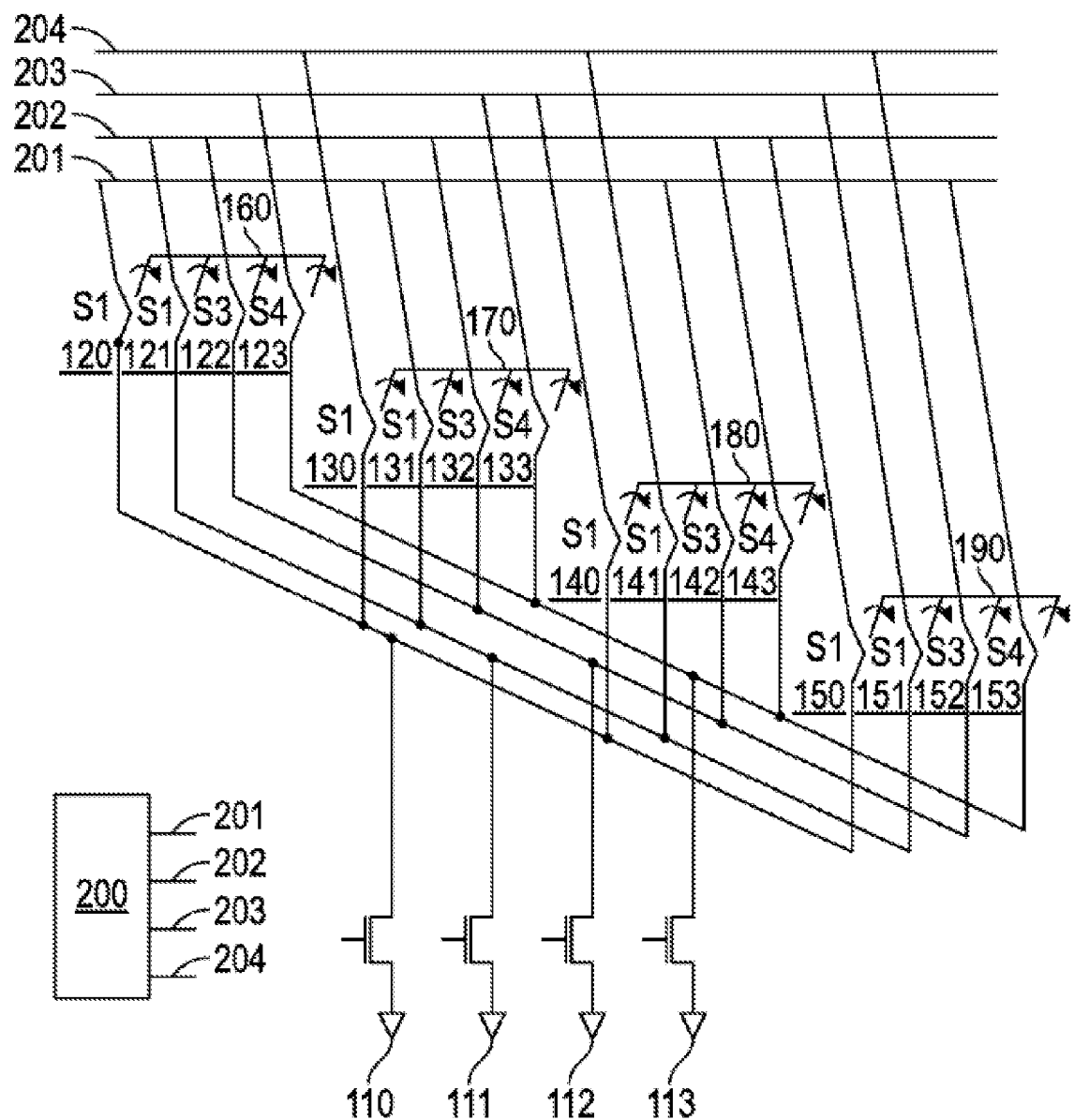
FIG. 2 depicts an embodiment for applying an average of a plurality of current mirrors to a memory array.

One of ordinary skill in the art will appreciate that the example of FIGS. 2 and 3 can be applied to an entire array of flash memory cells and corresponding current mirrors. One of ordinary skill in the art also will appreciate that the same principles can be used to average any number of current mirrors instead of four current mirrors. For example, two current mirrors, eight current mirrors, or any other number of current mirrors could be averaged over one programming period using the same principles described with reference to FIGS. 2 and 3.

Another embodiment is now described with reference to FIG. 4. Dynamic programming circuit 300 comprises current source 310 and memory cell replica 320. Memory cell replica 320 is of the same design as the memory cells in the flash memory array in question (not shown). The gate of exemplary current mirror 340 is coupled to capacitor 350. In another embodiment there is no capacitor 350, instead the gate capacitance of the current mirror 350 serves as an acting capacitor. Capacitor 350 is coupled to current source 310 through switch 330, and the drain of current mirror 340 is coupled to memory cell replica 320. The memory cell replica 320 has a gate bias 360 emulating the gate programming voltage of the memory cell. As shown the current mirror 340 is enhancement NMOS transistor. Alternatively, the current mirror 340 can be PMOS transistor.

During an initial programming mode, switch 330a is turned "on" and capacitor 350a is connected to current source 310, and the drain of current mirror 340a is coupled to memory cell replica 320. Capacitor 350a will be charged until the current through current mirror 340a matches the current of current source 310. Current source 310 is chosen to generate the ideal level of current that is desired for current mirror 340 and other current mirrors, such as 1.0 µA. The memory cell replica 320 with its gate voltage 360 forces a replica drain programming voltage on the drain of the current mirror 340a. This voltage will significantly be the same as in actual memory cell programming operation.

After the initial programming mode is complete, switch 330a is turned "off," and thereafter capacitor 350a is no longer connected to current source 310 and hence now holding a bias voltage on its terminal (same as gate of the current mirror 340), and the drain of current mirror 340 is no longer connected to memory cell replica 320. Now an operational programming mode is applied in which current mirror 340 can be used to program one or more memory cells in the memory array. As can be appreciated, all current mirrors in the system can be programmed in the same manner discussed above for current mirror 340. Alternatively the initial programming mode (initialization programming period) can be applied sequentially for all the current mirrors 340a to 340n. Then in the operational programming mode all current mirrors 340a-n are applied to selected bitlines IO0, IO1, ..., ION-1, ION, of selected memory cells for the programming operation at the same time.

Figure 4:
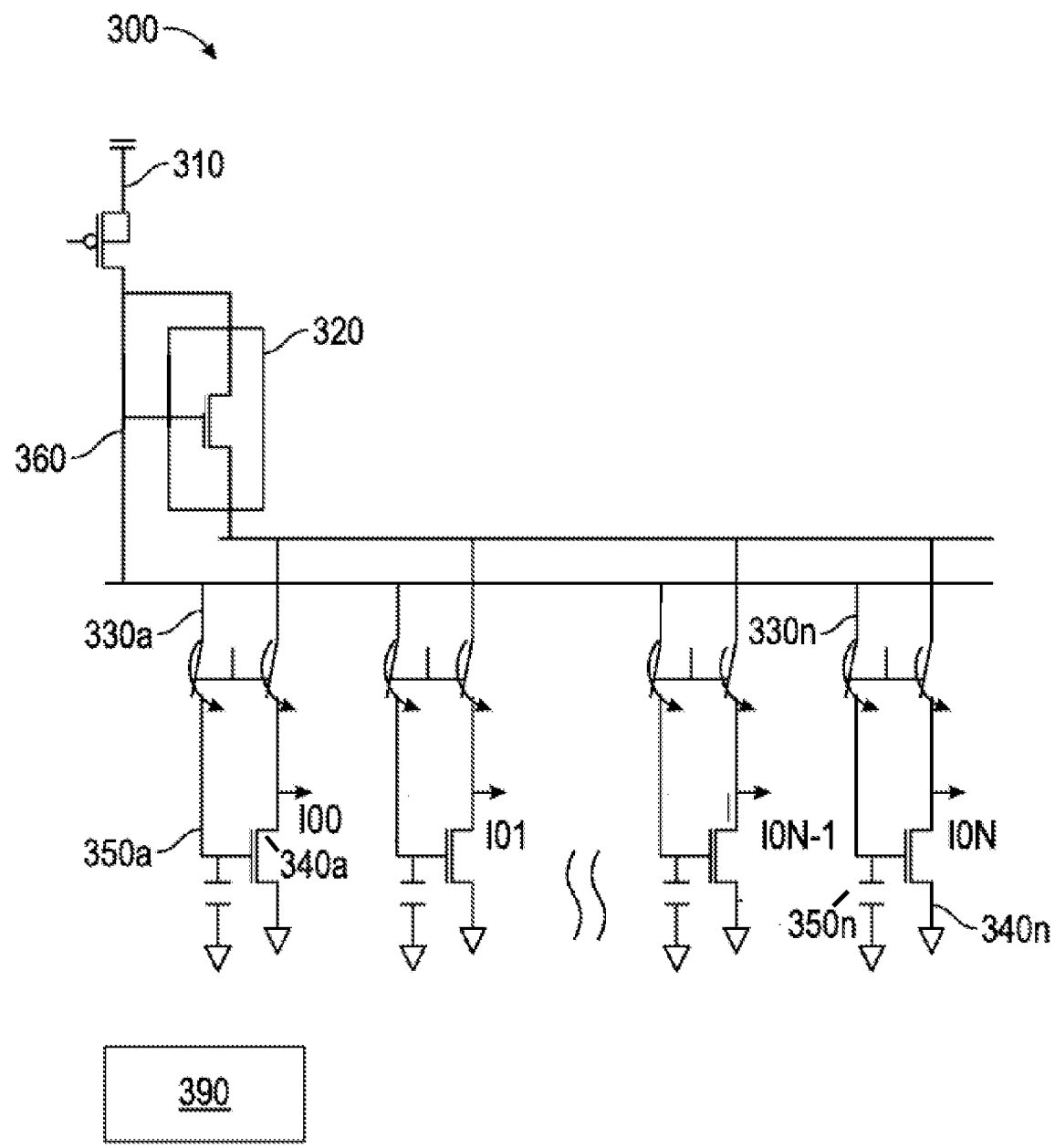
FIG. 4 depicts an embodiment of a programming circuit, where each current mirror is first initialized before being used to program memory cells.

Thus, the embodiment of FIG. 4 creates a way to initialize the current mirrors of a system to cause them to operate in a near-ideal state with exact programming current with ideal drain programming voltage.

Figure 5:
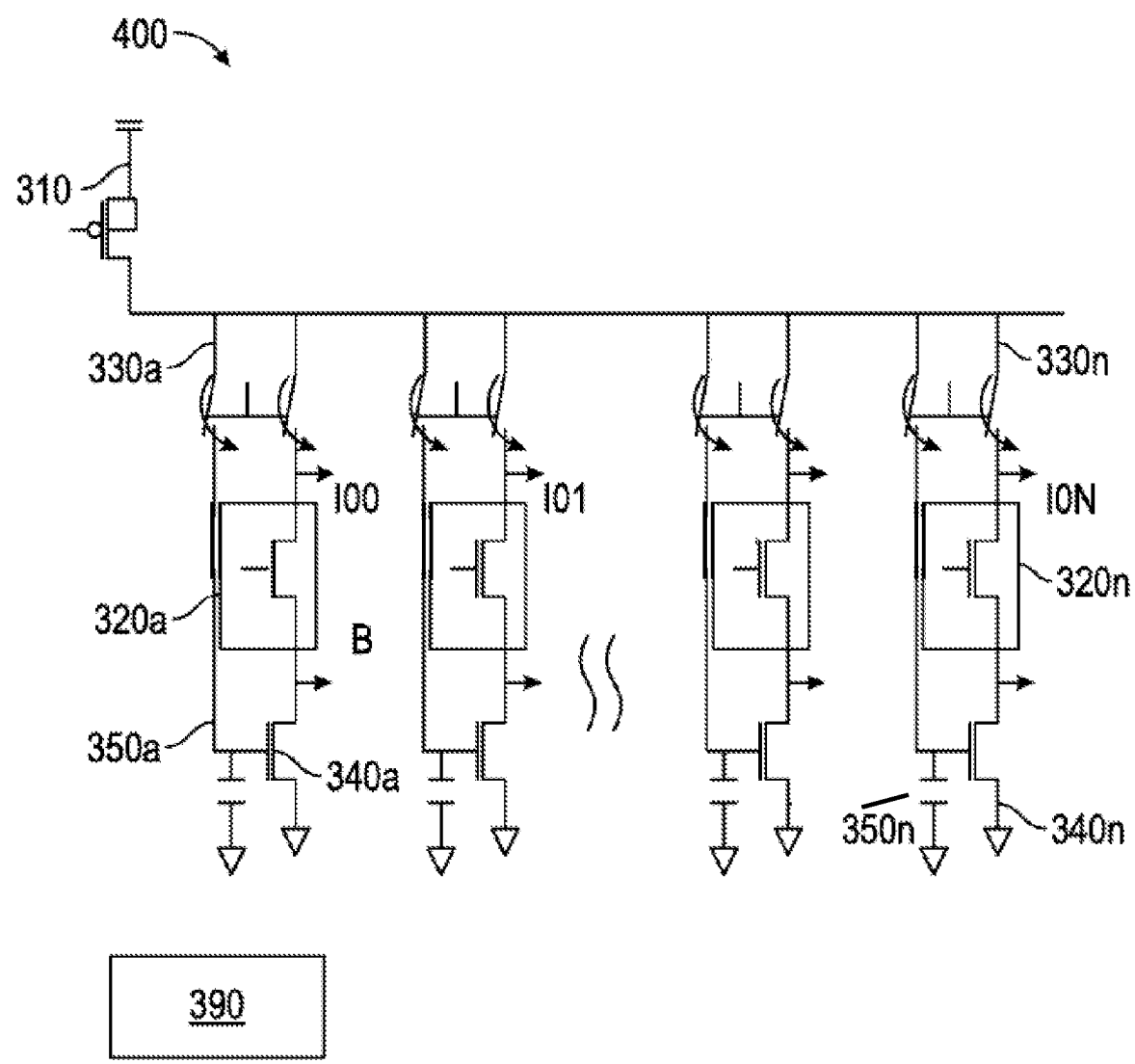
FIG. 5 depicts another embodiment of a programming circuit, where each current mirror is first initialized before being used to program memory cells.

A variation of the embodiment of FIG. 4 is now shown in FIG. 5 as programming circuit 400. The same devices previously shown in FIG. 4 are shown in FIG. 5 as well and will not be described again for efficiency's sake. However, in FIG. 5, current source 310 couples directly to switch 330a, and switch 330a couples to memory cell replica 320a, and memory cell replica 320a then is coupled to the drain of current mirror 340a. The circuit will otherwise operate the same as in FIG. 4 and the current mirrors can be programmed such that they initially operate in a near-ideal state during operational mode.

The programming of current mirrors in the systems of FIGS. 4 and 5 are controlled by controller 390. Controller 390 will control switch 330a-n and the other switches and also will ensure that current mirror 340a-n and the other current mirrors are not used for operation of the memory array during the programming mode.

During the operational mode of the embodiments for FIGS. 4 and 5, the charge of capacitor 350 initially will keep current mirror 340 teach coupled to a bit line IO0, ..., ION) operating in a state where it draws the same level of current as current source 310. This effect will diminish over time as capacitor 350 loses its charge through normal leakage. Once the charge of capacitor is completely lost, then current mirror 340 will operate as it would have operated had the programming mode never occurred.

Figure 6:
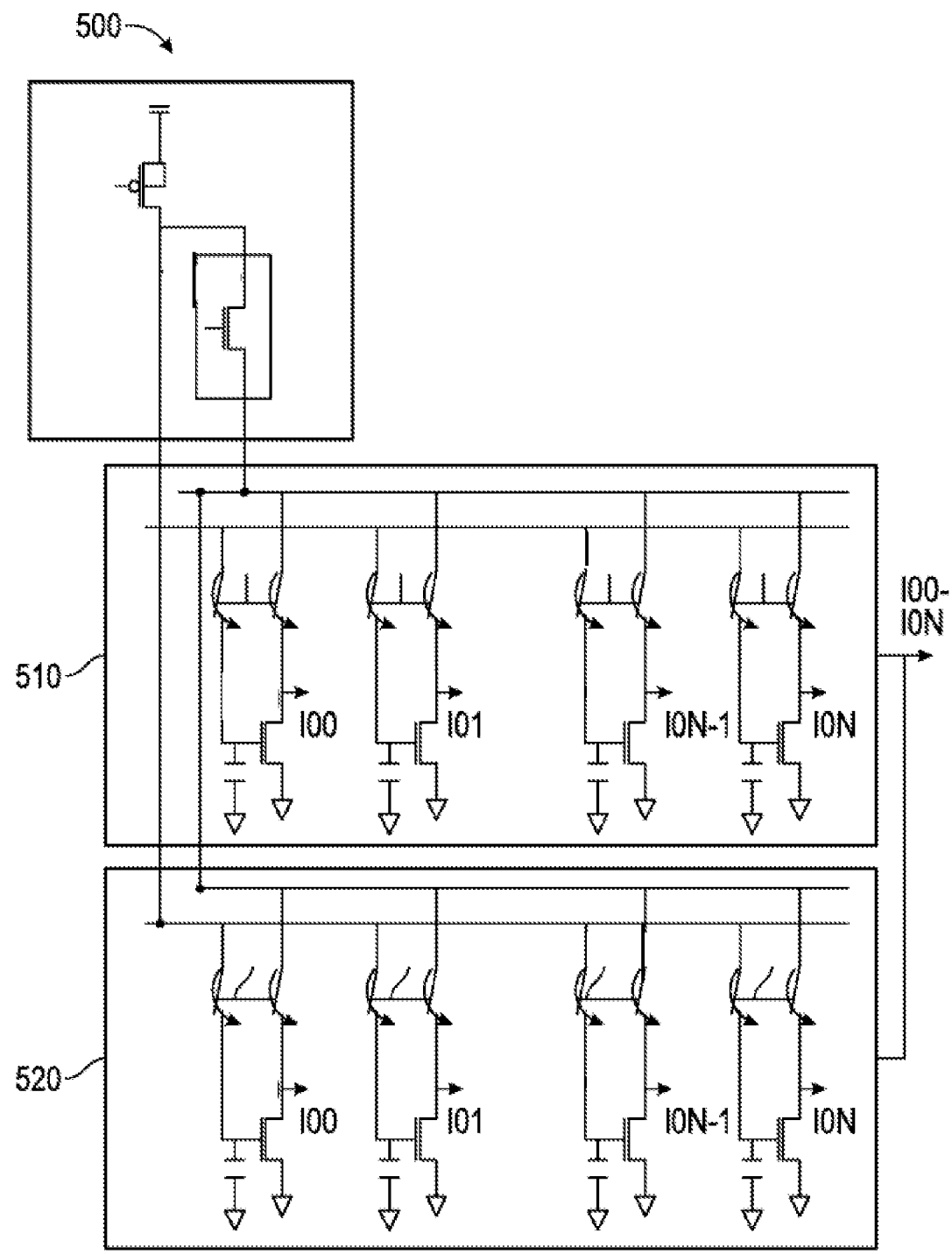
FIG. 6 depicts another embodiment of a programming circuit, where a first plurality of current mirrors and a second plurality of current mirrors are alternately initialized and used to program memory cells.

In response to this challenge, a further embodiment is shown in FIG. 6. FIG. 6 depicts another dynamic programming circuit 500. Dynamic programming circuit comprises a first plurality 510 of programmable current mirrors and a second plurality 520 of programmable current mirrors. The first plurality 510 of current mirrors and second plurality 520 of current mirrors can be based upon one or both of the embodiments of FIGS. 4 and 5. When the first plurality 510 is being programmed (in programming mode), the second plurality 520 is used for actual operation (operational mode) by connecting to bit lines IO0, . . . ION of the flash memory array (not shown). After a time period elapses, the first plurality 510 is then used for actual operation of the flash memory array (operational mode) by connecting to bit lines IO0, . . . ION, and the second plurality 520 is programmed (programming mode). After another elapse of time ti, the first plurality enters programming mode and the second plurality 510 enters operation mode, and so on. The time period is selected to be a time interval such that capacitive charge has not yet diminished to such a point that the operation of the associated current mirror has reached an undesirable level. For example, the time period might be chosen to be 1 ms in certain systems.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A programming circuit for use in a memory device, comprising:
   a current source;
   a transistor;
   a capacitor coupled to a gate of the transistor;
   a memory cell replica coupled to the current source;
   a first switch for connecting the current source to the capacitor when the first switch is closed; and
   a second switch for connecting the memory cell replica to the transistor when the second switch is closed;
   wherein the transistor is capable of being coupled to a bit line to program a memory cell when the first switch is open and the second switch is open.

2. The circuit of claim 1, wherein the transistor is an NMOS transistor.

3. A method for programming a memory cell, comprising:
   coupling a current source to a capacitor through a first switch;
   coupling a replica memory cell to a transistor through a second switch;
   providing charge from the capacitor to a gate of the transistor; and
   programming the memory cell using the transistor.

4. The method of claim 3, wherein the transistor is an NMOS transistor.

* * * * *